(12) United States Patent
Masumoto et al.

(10) Patent No.: US 9,355,999 B2
(45) Date of Patent: May 31, 2016

(54) SEMICONDUCTOR DEVICE

(71) Applicant: Mitsubishi Electric Corporation, Tokyo (JP)

(72) Inventors: Hiroyuki Masumoto, Tokyo (JP); Hiroshi Kawata, Hyogo (JP); Manabu Matsumoto, Tokyo (JP); Yoshitaka Otsubo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/728,167

(22) Filed: Jun. 2, 2015

(65) Prior Publication Data

US 2016/0071821 A1   Mar. 10, 2016

(30) Foreign Application Priority Data

Sep. 10, 2014   (JP) .................................. 2014-184186

(51) Int. Cl.
| | | |
|---|---|---|
| *H01L 23/48* | (2006.01) | |
| *H01L 25/065* | (2006.01) | |
| *H01L 23/29* | (2006.01) | |
| *H01L 23/31* | (2006.01) | |
| *H01L 23/367* | (2006.01) | |
| *H01L 23/498* | (2006.01) | |

(52) U.S. Cl.
CPC .......... *H01L 25/0655* (2013.01); *H01L 23/293* (2013.01); *H01L 23/3107* (2013.01); *H01L 23/3675* (2013.01); *H01L 23/49838* (2013.01); *H01L 23/49894* (2013.01)

(58) Field of Classification Search
CPC ................... H01L 21/76843; H01L 21/76879; H01L 21/76883; H01L 23/53238; H01L 23/481; H01L 23/5226; H01L 2924/01079; H01L 2924/01078; H01L 2924/01029
USPC .................................. 257/773–774
See application file for complete search history.

(56) References Cited

U.S. PATENT DOCUMENTS

2014/0008814 A1*  1/2014  Chen ...................... H01L 23/481
                                                              257/774

* cited by examiner

*Primary Examiner* — Hoa B Trinh
(74) *Attorney, Agent, or Firm* — Studebaker & Brackett PC

(57) ABSTRACT

A semiconductor device includes: a substrate having an insulating resin and a metal pattern provided on the insulating resin; a mounted component mounted on the metal pattern; and an epoxy resin encapsulating the metal pattern and the mounted component, wherein a slit is provided in the metal pattern around the mounted component, and the insulating resin exposed from the metal pattern and the epoxy resin are brought into intimate contact with each other in the slit.

12 Claims, 4 Drawing Sheets

HEAT RELEASE PATH

SEMICONDUCTOR DEVICE

BACKGROUND OF THE INVENTION

1. Field of the Invention

The present invention relates to a semiconductor device in which mounted components mounted on a metal pattern on a substrate are encapsulated with an epoxy resin.

2. Background Art

A technique for improving the productivity and reliability of power semiconductor devices by encapsulation with an epoxy resin in which a filler is dispersed is coming into widespread use. However, the intimacy of contact of the epoxy resin with solder and the metal pattern is unsatisfactory and separation occurs starting from the interface therebetween. Therefore, stress due to expansion and shrinkage of the epoxy resin acts on wires, electronic mounted components and semiconductor chips when a heat history is applied, resulting in separation and changes in characteristics of the semiconductor chips.

Under such circumstances, a technique to prevent resin slippage around wires and semiconductor chips by providing slits in a metal pattern on a substrate such that an anchor effect is produced has been proposed (see, for example, Japanese Patent Laid-Open No. 2006-32617).

SUMMARY OF THE INVENTION

In the conventional device, ceramic is used as an insulating layer in the substrate and the ceramic and the epoxy resin are therefore in intimate contact with each other in the slits. However, since the difference between the linear expansion coefficients of the epoxy resin and the ceramic is large, stress is concentrated at the interface between the epoxy resin and the ceramic, resulting in a reduction in reliability of the device. There is, therefore, a need to apply a coating film between the epoxy resin and the ceramic, and the manufacturing cost is increased by adding a process step for applying the coating film.

In view of the above-described problem, an object of the present invention is to obtain a semiconductor device capable of securing reliability while limiting the increase in manufacturing cost.

According to the present invention, a semiconductor device includes: a substrate having an insulating resin and a metal pattern provided on the insulating resin; a mounted component mounted on the metal pattern; and an epoxy resin encapsulating the metal pattern and the mounted component, wherein a slit is provided in the metal pattern around the mounted component, and the insulating resin exposed from the metal pattern and the epoxy resin are brought into intimate contact with each other in the slit.

In the present invention, a slit is provided in the metal pattern around the mounted component. The movement of the epoxy resin is limited by the anchor effect of the slit. Limiting of stress is thus enabled. Also, the insulating resin is used as an insulating layer in the substrate so that the difference between the linear expansion coefficients of the epoxy resin provided as an encapsulation material and the insulating resin is reduced, thus enabling limiting of stress caused at the interface therebetween without using a coating film. Consequently, the reliability of the device can be secured while the increase in manufacturing cost is limited.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
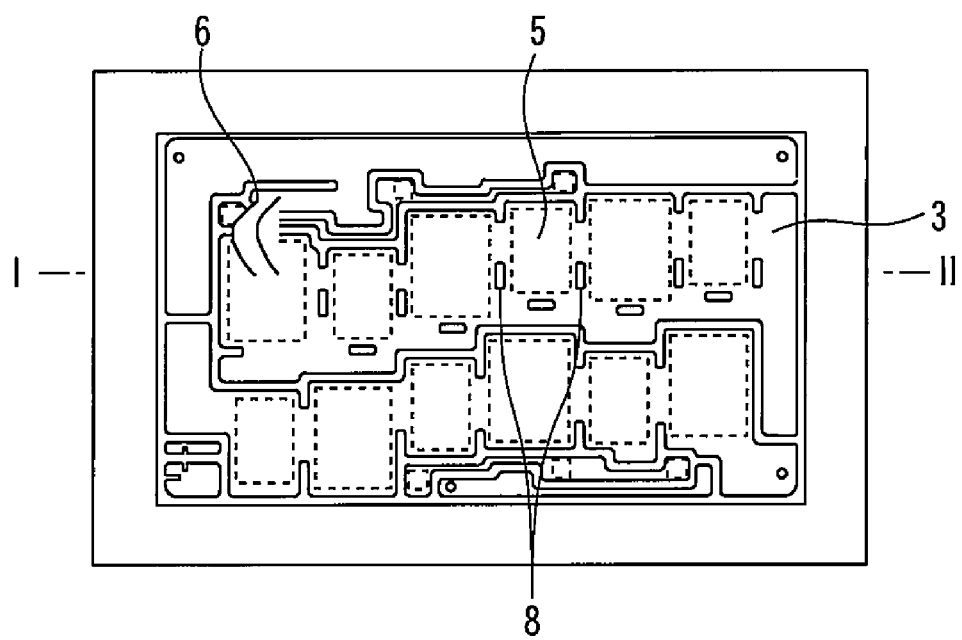
FIG. 1 is a plan view of a semiconductor device according to a first embodiment of the present invention.
Figure 2:
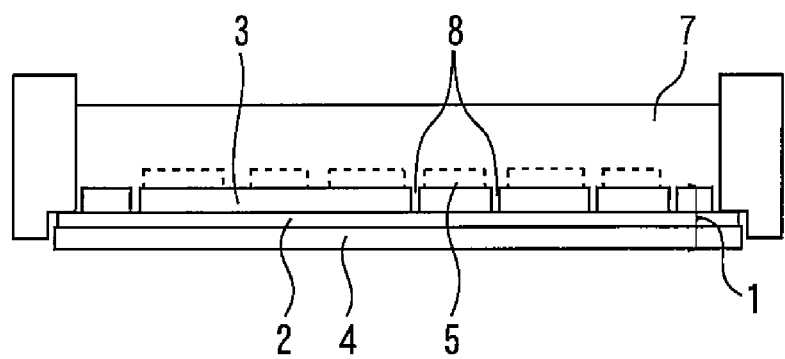
FIG. 2 is a sectional view taken along line I-II in FIG. 1.

FIG. 1 is a plan view of a semiconductor device according to a first embodiment of the present invention. FIG. 2 is a sectional view taken along line I-II in FIG. 1.

The substrate 1 has an insulating resin 2, a metal pattern 3 provided on the insulating resin 2 and a back pattern 4 provided on a back surface of the insulating resin 2. A mounted component 5 to be mounted is mounted on the metal pattern 3 by soldering. The mounted component 5 is, for example, a semiconductor chip. Wires 6 are bonded to the mounted component 5.

The metal pattern 3, the mounted component 5 and the wires 6 are encapsulated with an epoxy resin 7 in which a filler is dispersed. Slits 8 exist in the metal pattern 3 around the mounted component 5. In the slits 8, the insulating resin 2 exposed from the metal pattern 3 and the epoxy resin 7 are brought into intimate contact with each other.

In the present embodiment, slits 8 exist in the metal pattern 3 around the mounted component 5. The movement of the epoxy resin 7 is limited by the anchor effect of the slits 8. Limiting of stress is thus enabled. Also, the insulating resin 2 is used as an insulating layer in the substrate 1 so that the difference between the linear expansion coefficients of the epoxy resin 7 provided as an encapsulation material and the insulating resin 2 is reduced, thus enabling limiting of stress caused at the interface therebetween without using a coating film. Consequently, the reliability of the device can be secured while the increase in manufacturing cost is limited.

Second Embodiment

Figure 3:
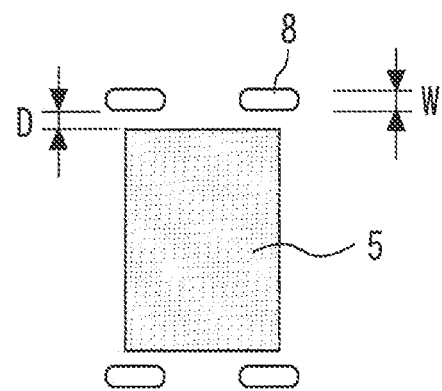
FIG. 3 is an enlarged plan view of an essential portion of a semiconductor device according to a second embodiment of the present invention.

FIG. 3 is an enlarged plan view of an essential portion of a semiconductor device according to a second embodiment of the present invention. In the present embodiment, straight slits 8 are provided in correspondence with four corner portions of the mounted component 5. Stress caused at the corner portions of the mounted component 5 can thereby be limited. From the viewpoint of sufficiently limiting stress, it is preferable that the distance D between the mounted component 5 and the slits 8 be 5 mm or less, and that the width W of the slits 8 be equal to or larger than the thickness of the metal pattern 3. In other respects, the construction and the effects are the same as those of the first embodiment.

Third Embodiment

Figure 4:
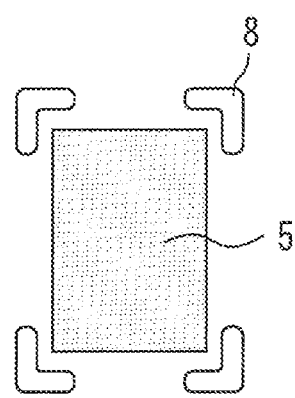
FIG. 4 is an enlarged plan view of an essential portion of a semiconductor device according to a third embodiment of the present invention.

FIG. 4 is an enlarged plan view of an essential portion of a semiconductor device according to a third embodiment of the present invention. In the present embodiment, L-shaped slits 8 are provided along the four corner portions of the mounted component 5. The effect of limiting stress caused at the corner portions of the mounted component 5 can thereby be improved. The L-shaped slits 8 serve as marks when the mounted component 5 is mounted, thereby enabling limiting of a misalignment of the mounted component 5. In other respects, the construction and the effects are the same as those of the first embodiment.

Fourth Embodiment

Figure 5:
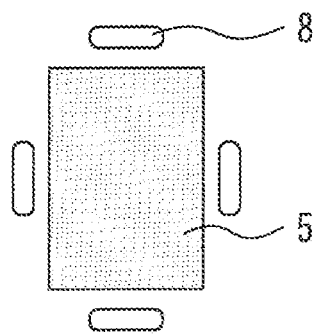
FIG. 5 is an enlarged plan view of an essential portion of a semiconductor device according to a fourth embodiment of the present invention.

FIG. 5 is an enlarged plan view of an essential portion of a semiconductor device according to a fourth embodiment of the present invention. In the present embodiment, straight slits 8 exist along the four sides of the mounted component 5, thereby enabling limiting of stress caused at the sides of the mounted component 5. In other respects, the construction and the effects are the same as those of the first embodiment.

Fifth Embodiment

Figure 6:
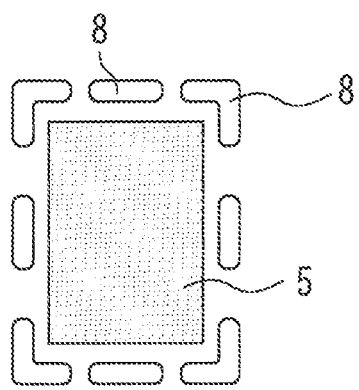
FIG. 6 is an enlarged plan view of an essential portion of a semiconductor device according to a fifth embodiment of the present invention.

FIG. 6 is an enlarged plan view of an essential portion of a semiconductor device according to a fifth embodiment of the present invention. In the present embodiment, L-shaped slits 8 exist along the four corner portions of the mounted component 5. Straight slits 8 also exist along the four sides of the mounted component 5. Both the effects of the third and fourth embodiments can thereby be obtained. In other respects, the construction and the effects are the same as those of the first embodiment.

Sixth Embodiment

Figure 7:
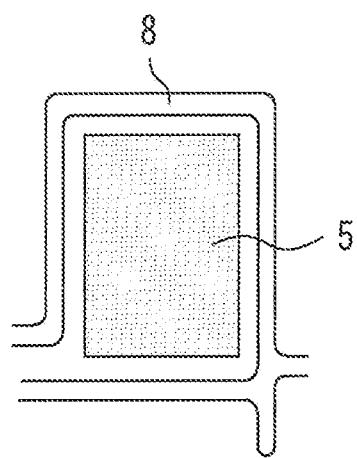
FIG. 7 is an enlarged plan view of an essential portion of a semiconductor device according to a sixth embodiment of the present invention.

FIG. 7 is an enlarged plan view of an essential portion of a semiconductor device according to a sixth embodiment of the present invention. In the present embodiment, a slit 8 surrounds the mounted component 5. Stress caused at the entire periphery of the mounted component 5 can thereby be limited. In other respects, the construction and the effects are the same as those of the first embodiment.

Seventh Embodiment

Figure 8:
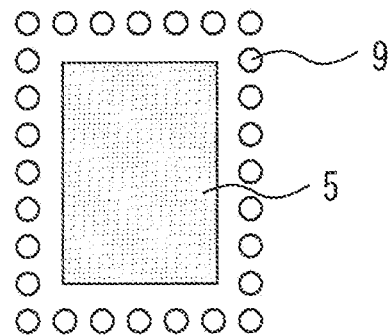
FIG. 8 is an enlarged plan view of an essential portion of a semiconductor device according to a seventh embodiment of the present invention.

FIG. 8 is an enlarged plan view of an essential portion of a semiconductor device according to a seventh embodiment of the present invention. In the present embodiment, a plurality of dimples 9 are formed as slits so as to surround the mounted component 5. Stress caused around the mounted component 5 can thereby be limited uniformly. Also, the heat releasability is improved in comparison with the sixth embodiment. In other respects, the construction and the effects are the same as those of the first embodiment.

Eighth Embodiment

Figure 9:
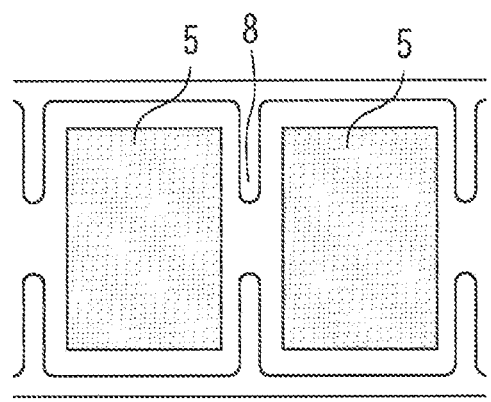
FIG. 9 is an enlarged plan view of an essential portion of a semiconductor device according to an eighth embodiment of the present invention.

FIG. 9 is an enlarged plan view of an essential portion of a semiconductor device according to an eighth embodiment of the present invention. In the present embodiment, slits 8 exist in portions of a region between two mounted components 5 spaced apart from each other. Stress caused between the two mounted components adjacent to each other is limited while electrical conduction therebetween is maintained. In other respects, the construction and the effects are the same as those of the first embodiment.

Ninth Embodiment

Figure 10:
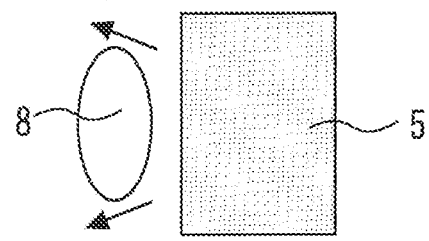
FIG. 10 is an enlarged plan view of an essential portion of a semiconductor device according to a ninth embodiment of the present invention.

FIG. 10 is an enlarged plan view of an essential portion of a semiconductor device according to a ninth embodiment of the present invention. In the present embodiment, a slit 8 is made elliptical. An increased opening area of the slit 8 can thereby be secured. As a result, the stress limiting effect is improved. Also, the heat release path can be increased in comparison with the case of providing straight slits. Therefore, the heat releasability is also improved. In other respects, the construction and the effects are the same as those of the first embodiment.

In the first to ninth embodiments, the mounted component 5 may be an electronic component such as a thermistor mounted so as to straddle two traces in the metal pattern 3. Each of the semiconductor devices according to the first to ninth embodiments can be applied to an inverter system.

The mounted component 5 is not limited to a semiconductor chip formed of silicon. The mounted component 5 may be formed of a wide-bandgap semiconductor having a bandgap larger than that of silicon. The wide-bandgap semiconductor is, for example, silicon carbide, a gallium nitride-based material or diamond. A semiconductor chip formed of such a wide-bandgap semiconductor has a high withstand voltage and a high allowable current density and can therefore be reduced in size. The semiconductor device incorporating this semiconductor chip reduced in size can also be reduced in size. Also, the heat resistance of the semiconductor chip is high. Therefore, heat-dissipating fins of a heat sink can be reduced in size and a water cooling portion can be replaced with an air cooling portion. As a result, the semiconductor module can be further reduced in size. Also, the semiconductor chip has a reduced power loss and high efficiency and the efficiency of the semiconductor module can therefore be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-184186, filed on Sep. 10, 2014 including specification, claims, drawings and summary, on which the Convention priority of the present application is based, is incorporated herein by reference in its entirety.

What is claimed is:

1. A semiconductor device comprising:
    a substrate having an insulating resin and a metal pattern provided on the insulating resin;
    a mounted component mounted on the metal pattern; and
    an epoxy resin encapsulating the metal pattern and the mounted component,
    wherein a slit is provided in the metal pattern around the mounted component, and
    the insulating resin exposed from the metal pattern and the epoxy resin are brought into intimate contact with each other in the slit.

2. The semiconductor device of claim 1, wherein the slit is provided in correspondence with a corner portion of the mounted component.

3. The semiconductor device of claim 2, wherein the slit is an L-shaped slit provided along a corner portion of the mounted component.

4. The semiconductor device of claim 1, wherein the slit is a straight slit provided along a side of the mounted component.

5. The semiconductor device of claim 1, wherein the slit includes an L-shaped slit provided along a corner portion of the mounted component and a straight slit provided along a side of the mounted component.

6. The semiconductor device of claim 1, wherein the slit surrounds the mounted component.

7. The semiconductor device of claim 1, wherein the slit is a plurality of dimples surrounding the mounted component.

8. The semiconductor device of claim 1, wherein the mounted component includes two mounted components spaced apart from each other, and
   the slit is provided in a portion of a region between the two mounted components.

9. The semiconductor device of claim 1, wherein the slit is made elliptical.

10. The semiconductor device of claim 1, wherein a distance between the mounted component and the slit is 5 mm or less.

11. The semiconductor device of claim 1, wherein a width of the slit is equal to or larger than a thickness of the metal pattern.

12. The semiconductor device of claim 1, wherein the mounted component is formed of a wide-bandgap semiconductor.

* * * * *